United States Patent
Privitera et al.

(10) Patent No.: US 8,952,492 B2
(45) Date of Patent: Feb. 10, 2015

(54) HIGH-PRECISION RESISTOR AND TRIMMING METHOD THEREOF

(75) Inventors: Stefania Maria Serena Privitera, Catania (IT); Antonello Santangelo, Belpasso (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 679 days.

(21) Appl. No.: 13/173,214

(22) Filed: Jun. 30, 2011

(65) Prior Publication Data

US 2012/0001679 A1 Jan. 5, 2012

(30) Foreign Application Priority Data

Jun. 30, 2010 (IT) .............. TO2010A0559

(51) Int. Cl.
  *H01L 27/06* (2006.01)
  *H01C 17/26* (2006.01)
  *H01C 7/00* (2006.01)
  *H01C 7/06* (2006.01)
  *H01L 21/66* (2006.01)
  *H01L 49/02* (2006.01)

(52) U.S. Cl.
  CPC ............. *H01C 17/267* (2013.01); *H01C 7/006* (2013.01); *H01C 7/06* (2013.01); *H01L 22/14* (2013.01); *H01L 22/20* (2013.01); *H01L 22/26* (2013.01); *H01L 28/24* (2013.01)
  USPC .................. 257/536; 257/E27.047

(58) Field of Classification Search
  None
  See application file for complete search history.

(56) References Cited

U.S. PATENT DOCUMENTS

| 4,210,996 A | 7/1980 | Amemiya et al. |
| 4,870,472 A | 9/1989 | Vyne |

(Continued)

FOREIGN PATENT DOCUMENTS

| EP | 2200049 | 6/2010 |
| WO | WO 2010068221 A1 * | 6/2010 |

OTHER PUBLICATIONS

T. Matsunaga, H. Morita, R. Kojima, N. Yamada, K. Kifune, Y. Kubota, Y. Tabata, J.-J. Kim, M. Kobata, E. Ikenaga, and K. Kobayashi, "Structural characteristics of GeTe-rich GeTe—Sb2Te3 pseudobinary metastable crystals", American Institute of Physics, Journal of Applied Physics, vol. 103, 093511, (2008), pp. 9.

(Continued)

*Primary Examiner* — Wensing Kuo
(74) *Attorney, Agent, or Firm* — Allen, Dyer, Doppelt, Milbrath & Gilchrist, P.A.

(57) ABSTRACT

An embodiment of an electrically trimmable electronic device, wherein a resistor of electrically modifiable material is formed by a first generally strip-shaped portion and by a second generally strip-shaped portion, which extend transversely with respect to one another and are in direct electrical contact in a crossing area. The first and second portions have respective ends connected to own contact regions, coupled to a current pulse source and are made of the same material or of the same composition of materials starting from a same resistive layer of the material having electrically modifiable resistivity, for example, a phase-change material, such as a Ge—Sb—Te alloy, or polycrystalline silicon, or a metal material used for thin-film resistors. The trimming is performed by supplying a trimming current to the second portion so as to heat the crossing area and modify the resistivity thereof, without flowing longitudinally in the first portion.

26 Claims, 8 Drawing Sheets

(56) References Cited

U.S. PATENT DOCUMENTS

| | | |
|---|---|---|
| 5,466,484 A | 11/1995 | Spraggins et al. |
| 5,587,097 A | 12/1996 | Sato et al. |
| 5,635,893 A | 6/1997 | Spraggins et al. |
| 5,679,275 A | 10/1997 | Spraggins et al. |
| 5,757,264 A | 5/1998 | Petit |
| 5,808,197 A | 9/1998 | Dao |
| 6,097,276 A | 8/2000 | Van Den Broek et al. |
| 6,621,404 B1 | 9/2003 | Banerjee |
| 6,647,614 B1 | 11/2003 | Ballantine et al. |
| 6,960,744 B2 | 11/2005 | Adkisson et al. |
| 7,217,981 B2 | 5/2007 | Coolbaugh et al. |
| 7,249,409 B2 | 7/2007 | Landsberger et al. |
| 2010/0073122 A1 | 3/2010 | Le Neel et al. |
| 2010/0156588 A1 | 6/2010 | Privitera |

OTHER PUBLICATIONS

Search Report for Italian Application Serial No: TO20100559, Ministero dello Sviluppo Economico, Munich, Mar. 18, 2011, pp. 2.
Stefan Lai and Tyler Lowrey, "OUM—A 180 nm Nonvolatile Memory Cell Element Technology for Stand Alone and Embedded Applications", 2001 IEEE, IEDM 01-803, pp. 36.5.1-36.5.4.

* cited by examiner

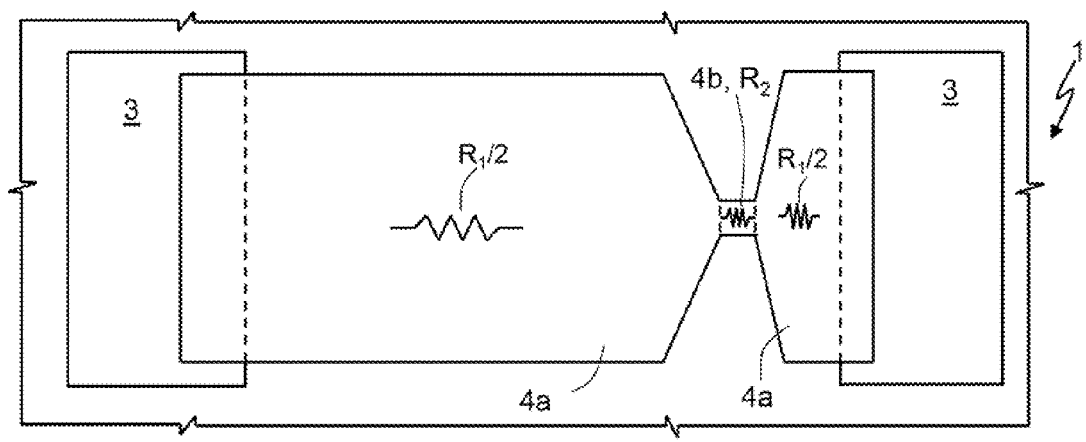
Fig.1 BACKGROUND OF ART
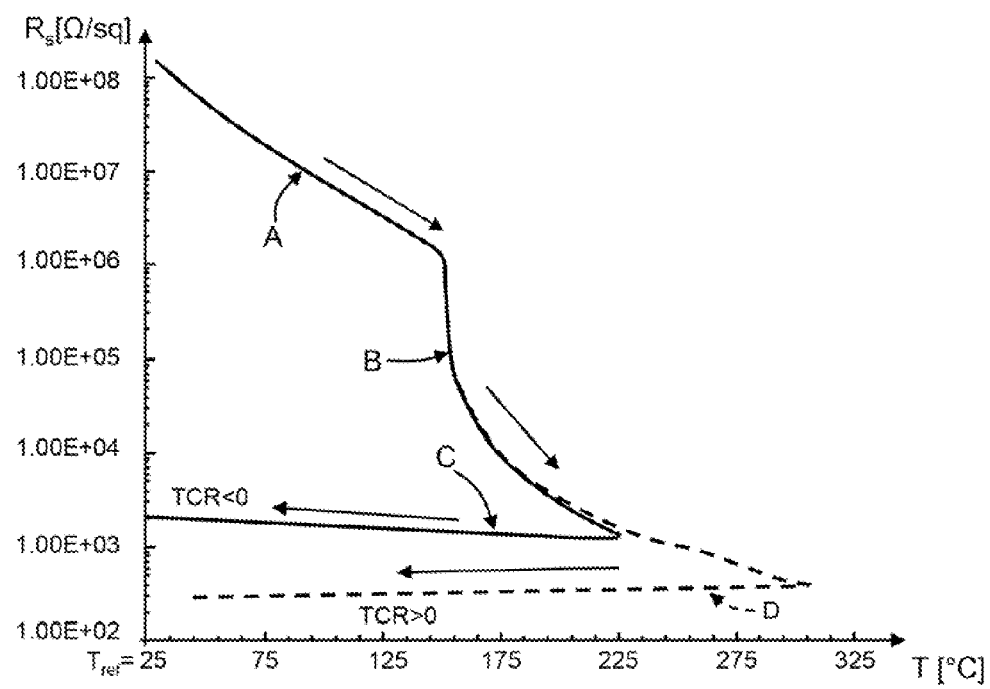
Fig.2

HIGH-PRECISION RESISTOR AND TRIMMING METHOD THEREOF

PRIORITY CLAIM

The instant application claims priority to Italian Patent Application No. TO2010A000559, filed Jun. 30, 2010, which application is incorporated herein by reference in its entirety.

TECHNICAL FIELD

An embodiment relates to a high-precision resistor and the trimming method thereof.

BACKGROUND

Many integrated circuits use thin-film resistors, usually for controlling the current or the voltage of other components of the integrated circuit. Thin-film resistors are typically deposited by evaporation in vacuum conditions or by sputtering and are made of different materials, such as CrSi, TaN, NiCr.

Even though very well controlled processes are used, the initial resistance of these components has a tolerance of 3-15%, according to the desired value of resistance. More accurate values may be obtained by physically removing portions of the resistor in a subsequent trimming operation, carried out via laser during electrical wafer sorting (EWS). For this purpose, laser-beam trimming systems have been developed, which present various advantages, such as speed, accuracy, and cleanliness. These systems may be controlled via computer for modifying and adjusting the electrical parameters of the components during measurement.

Other trimming techniques, such as electrical trimming or reconfiguration of a network of resistors by means of fuses, may be used even after packaging.

In high-precision resistors, another important factor to be taken into consideration is the variation of resistance with temperature. For example, current-reference circuits use load resistors for controlling the current level. As the operating temperature of the circuit changes, also the current changes.

Even though in order to manufacture good resistors high-resistivity materials may be used, they typically have a high temperature coefficient of resistance (TCR), higher than 100 ppm/° C. TCR is defined as the normalized first derivative of the resistance with respect to the temperature and provides an adequate way for measuring the performance of a resistor.

To obtain resistors with an almost zero TCR, various solutions have been proposed, such as resistors connected in series or in parallel, of different materials having different TCRs, and more precisely positive and negative TCRs matched so that the effective temperature coefficient is almost zero (see, for example, U.S. Pat. No. 7,217,981, which is incorporated by reference). These solutions are however rather complex and may require various interconnection levels and the use of costly laser trimming apparatuses.

Italian patent application TO2008A000951, filed on 18 Dec. 2008 (corresponding to EP patent application 09179740.7 and U.S. patent application Ser. No. 12/638, 922), all of which are incorporated by reference, describe a resistor of phase-change material formed by two portions with different crystalline phases, so as to have opposite TCRs, and electrically coupled so as to obtain a resistor with an approximately zero global TCR.

In this resistor, the precise value of the resistance is obtained via laser trimming or electrical trimming so as to cause a phase change in one of the two portions. In particular, electrical trimming may be carried out by feeding the resistor with current pulses so as to heat the material and to obtain the phase change envisaged for adjusting the resistance and the temperature coefficient. This technique has proven particularly effective where the resistor has an area of smaller width than the rest of the resistor since, in this case, only in this point there is a current crowding such as to heat the material by the Joule effect up to melting point and to cause the phase and resistance change. Trimming is thus practically confined to this smaller area.

This solution has proven advantageous, but in some cases it may require forcing high currents and/or applying high voltages to the resistor to be trimmed. The application of high electrical quantities, however, may damage the resistor or the device that integrates it. Furthermore, the trimming current depends upon the resistor geometry, which may require remodulating the trimming method (and in particular the current and voltage to be applied to obtain a desired variation of resistance), whenever the resistor geometry is changed.

SUMMARY

An embodiment is a resistor that may be electrically trimmed in a simple and precise way, thus reducing the risk of damage.

BRIEF DESCRIPTION OF THE DRAWINGS

For a better understanding of the concepts disclosed herein, one or more embodiments are now described, purely by way of non-limiting example, with reference to the attached drawings, wherein:

FIG. 1 is a top plan view of an embodiment of the phase-change resistor forming the subject of the aforementioned Italian patent application TO2008A000951, which is incorporated by reference;

FIG. 2 shows the sheet resistance as a function of the temperature for a phase-change material;

DETAILED DESCRIPTION

Figure 3:
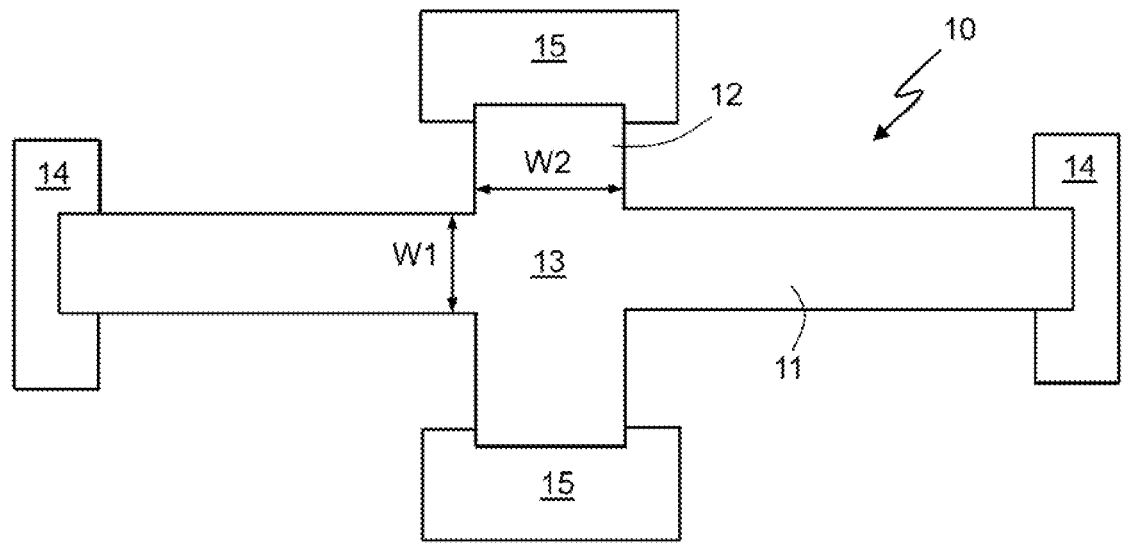
FIG. 3 is a top plan view of an embodiment of the present resistor.

In an embodiment, the present high-precision resistor is formed by a functional resistor and by a trimming resistor, transverse to the functional resistor and, for example, of the same material (or of the same combination of materials) and starting from the same layer as the functional resistor. If the functional resistor is made by combining two different materials (also possibly separated by an intermediate dielectric layer), the trimming resistor may be made of the same combination of materials or with just one of the materials, using the most advantageous one for the purposes of an optimal trimming.

The trimming resistor is provided with its own connections and is coupled to a suitable electrical circuit so as to be traversed by a current that may be modulated such as to heat the functional resistor in the crossing point and thus modify the resistance value and the temperature coefficient thereof. The functional resistor, which is part of a user circuit exploiting the precision and/or the low TCR of the functional resistor, is no longer traversed longitudinally by the trimming current. Therefore, no voltage drop exists across the functional resistor and, thus, across the circuit it is coupled to.

The present high-precision resistor may thus be used in all circuits that include an electrically trimmable high-precision resistor. Thus, it may be made of various materials, such as phase-change materials, polysilicon, metal alloys, such as SiCr, NiCr, TaN, SiTa, etc., normally used for the production of thin-film resistors. Phase-change materials are characterized by sharp variations of the electrical characteristics following upon phase transitions. In this context, in particular the resistivity and TCR variations due to reversible phase transitions obtained by heating and possibly melting as a result of electrical pulses are considered.

Consequently, in the following description, specific reference will be made to a high-precision resistor of phase-change material, and more in particular to a resistor of the type described in above-mentioned patent application TO2008A000951, which is incorporated by reference, in its embodiments with electrical trimming, without, however, being limited thereto.

For a better understanding, a generic embodiment of the known resistor and its operating principle are described hereinafter, with reference to FIGS. 1 and 2.

FIG. 1 shows a resistor 1 of phase-change material comprising a resistive region 4 formed by a single strip of phase-change material, having two ends in electrical contact with metal regions 3.

The resistive region 4 comprises at least two areas 4a, 4b having a different crystalline phase, so as to have opposite behaviors as the temperature varies. In FIG. 1, as represented schematically by the dashed boundaries, the crystalline region 4 comprises two first areas 4a, in a first phase (metallic phase, as explained hereinafter) and a second area 4b, here in an intermediate position and in a second phase (semiconductor phase, as explained hereinafter). Furthermore, the second area 4b has a smaller width than the first area 4a so as to cause a current crowding and a confinement of the phase-change area, during electrical trimming, as explained hereinafter.

In fact, phase-change materials have stable phases ranging from the completely amorphous phase and the crystalline phase stable at high temperatures, including the intermediate phases. FIG. 2 shows the sheet resistance $R_s$ of a phase-change layer of $Ge_2Sb_2Te_5$, which, starting from the amorphous phase, is heated at a rate of 15° C./min and then cooled. The solid line shows the sheet resistance when heating up to 225° C. at the rate indicated above, and subsequent cooling; the dotted line shows the profile when heating up to 325° C. at the same rate, and subsequent cooling.

In either case, the dependence of the resistance upon the temperature during cooling is markedly different from its initial behavior. In particular, the fast reduction of the resistance corresponds to a phase transition. A first phase transition, which is noted at approximately 155° C. (knee between stretches A and B) corresponds to the transition from the amorphous phase to the polycrystalline phase, which corresponds to a sharp reduction of the resistance. A second phase transition occurs where shown with dotted line (turning point between stretch B and stretch D) and corresponds to the passage from one polycrystalline phase to a different polycrystalline phase, characterized by lower resistance and by a positive temperature coefficient (TCR>0), which is typical of metal materials. The polycrystalline phase described by the stretch of curve D is thus identified as metallic phase. In the case represented by the solid line, the second phase transition is not obtained so that the stretch of curve C, with negative temperature coefficient, describes the behavior of phase-change material regions identified hereinafter as being in the semiconductor phase.

In case of phase-change materials of alloys of GeSbTe with compositions on the pseudobinary line $GeTe$—$Sb_2Te_3$, the phase formed at a lower temperature typically has a face-centred cubic (fcc) structure and is characterized by a resistivity ranging from $3^{-3}$ to $3^{-2}$ $\Omega cm$, according to the composition. The phase formed at a higher temperature has a hexagonal structure and a resistivity ranging from $3^{-4}$ to $3^{-3}$ $\Omega cm$.

Consequently, different production temperatures for the phase-change material layers give rise to different resistivities and different temperature coefficients.

Getting back to FIG. 1, the resistor 1 is equivalent to the series-connection of two resistors having, respectively, a first resistance $R_1$ (here formed by the sum of the two first areas 4a, each of resistance $R_1/2$) and a second resistance $R_2$ (here, formed by the second area 4b). The two resistances $R_1$, $R_2$ are characterized, respectively, by a first resistivity $\rho_1$ and a second resistivity $\rho_2$, corresponding, respectively, to the metallic phase and to the semiconductor phase (i.e., having the behavior described by the curve stretch D and by the curve stretch C, respectively). Furthermore, the two resistances $R_1$, $R_2$ have respective temperature coefficients $\alpha_1$ and $\alpha_2$ and respective geometrical factors $N_1$ and $N_2$ (defined as L/S, where L is the length of the respective area 4a, 4b of the resistive region 4—as sum of the two areas 4a—and S is the cross-section of the resistive region 4, which is the same for both areas).

For the resistor 1 it may be demonstrated that there exists a relation between the respective temperature coefficients and the respective geometrical factors such that the resistor 1 has a global temperature coefficient approximately zero and a given resistance R.

In particular it may be demonstrated that:

$$N_2 = R\alpha_1/(\rho_2\alpha_1 - \rho_1\alpha_2)$$

$$N_1 = -R\alpha_2/(\rho_2\alpha_1 - \rho_1\alpha_2)$$

and the geometrical factors $N_1$ and $N_2$ must satisfy the relation $$N_2/N_1 = -\alpha_1/\alpha_2 \quad (1)$$

Consequently, the resistor 1 may be obtained by depositing the resistive region 4 at a first temperature, so that it is initially in the metallic phase, and by modifying the resistivity of one of the two areas 4a, 4b (typically, the second area 4b) via annealing so as to bring it into the semiconductor phase and to satisfy Eq. (1). In particular, the second area 4b is melted at a second temperature and then left to rapidly cool so as to be brought into the semiconductor phase, at the desired resistivity.

In the above patent application, thus, the second area undergoes a phase transition as a result of an electric current that flows along the entire resistor 1.

Instead, in the present resistor, the trimming is obtained by causing a trimming current to flow transversely with respect to the "functional" resistor, using a transverse "trimming" resistor, as described hereinafter.

Figure 4:
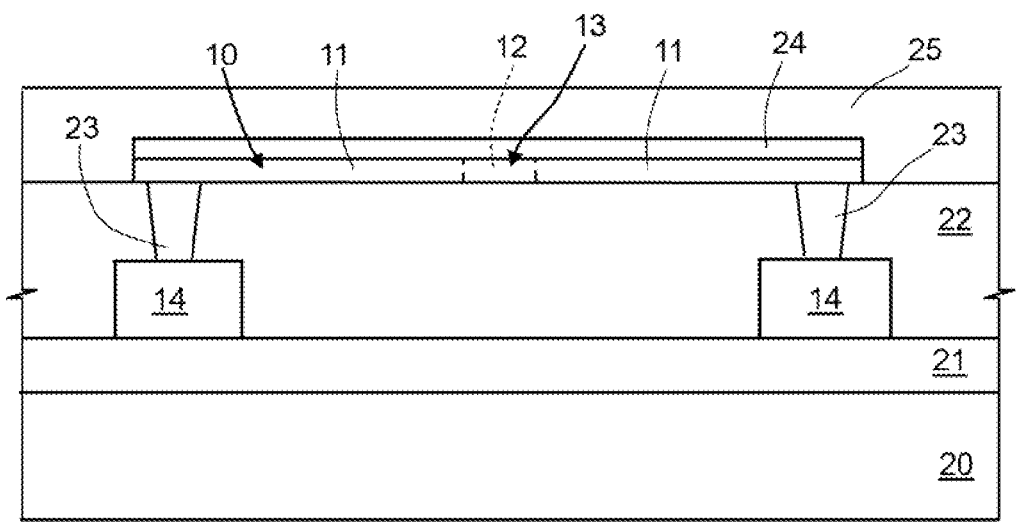
FIG. 4 is a cross-section of the resistor of FIG. 3.

In detail, FIGS. 3 and 4 show a generally cross-shaped resistor 10, including a first portion 11 and a second portion 12, both strip-shaped, which cross one another, delimiting a crossing area 13. The portions 11, 12 are formed here from a same material layer, cross-shaped on a planar support and are thus coplanar, at least at the crossing area 13. The first portion 11, having a width W1 and a first resistance $R_1$, forms the functional resistor and has ends coupled to first metal connection regions 14. The second portion 12, having a width W2 and a second resistance $R_2$, forms the trimming resistor and has ends coupled to second metal connection regions 15.

The resistor 10 of FIG. 3 may be symmetrical with respect to a plane perpendicular to the drawing sheet and extending along the longitudinal axis of the first portion 11.

The resistor 10 may be formed on a substrate 20 and have the cross-section illustrated in FIG. 4. The substrate 20 may be a semiconductor substrate, a SOI (Silicon-on-Insulator) substrate, or a flexible substrate with transistors and other integrated electronic components inside it or on its surface. A first dielectric layer 21, for example, an oxide layer, extends on the substrate 20. The metal regions 14, 15 (only the first regions 14 whereof are visible in FIG. 4) extend here on the first dielectric layer 21 and are covered by an intermediate dielectric layer 22. The intermediate dielectric layer 22 may be a single layer or a multilayer of TEOS (tetraethylorthosilicate), spin-on glass, FSP (fluorinated silicon glass), PBSG (phosphorus boron silicon glass), or other dielectric, in a per se known manner.

Vias 23 extend through the intermediate dielectric layer 22 and couple the first metal regions 14 to the ends of the first portion 11. Similar vias (not illustrated in FIG. 4) couple the second metal regions 15 (not visible in FIG. 4 either) to the ends of the second portion 12. The vias 23 may be formed by an appropriate barrier layer (for example, of Ti or TiN), and are filled, for example, with tungsten. The resistor 10 has a constant thickness, comprised, for example, in the 20 to 200-nm range, according to the resistance desired, and for example is of a calcogenide or calcogenic alloy comprising Ge, Sb and Te, such as $Ge_2Sb_2Te_5$ (also referred to as GST). A protective layer 24 and a passivation layer 25 extend on the resistor 10. The protective layer 24 may be of silicon oxide, silicon nitride, or other dielectric, and the passivation layer 25 may be of silicon oxide, silicon nitride, or a combination thereof.

According to an embodiment, it may be possible to manufacture the resistor 10 by depositing a GST layer at a first temperature and then cross-shape it, using known photolithographic processes so that both the portions 11 and 12 are initially in the same metallic phase.

Next, the resistivity of the second portion 12 is modified so as to bring it into the semiconductor phase at least at the crossing area 13. To this end, an electrical pulse is applied to just the second portion 12 such as to bring this second portion 12 to a second temperature in order to melt it and is then left to cool so that it passes into the semiconductor phase. In this way, a phase transition of the second portion 12 with respect to the original phase is obtained.

To a first approximation, neglecting the thermal losses due to diffusion, the power P required to heat a volume V of phase-change material may be given by the following equation:

$$P = Cp V dT/dt$$

where Cp is the thermal capacity of the material and dT/dt (derivative of the temperature with respect to time) may be approximated to $\Delta T/t_0$, where $\Delta T$ is the variation of temperature to which the material is subjected, and $t_0$ is the pulse duration. From the relation $P=I^2R$ it may thus be possible to derive the electrical parameters (current/voltage) to be used to obtain the desired trimming.

The step of electrical trimming does not, however, involve the first portion (functional resistor) 11, except for the crossing area 13.

Figure 5A:
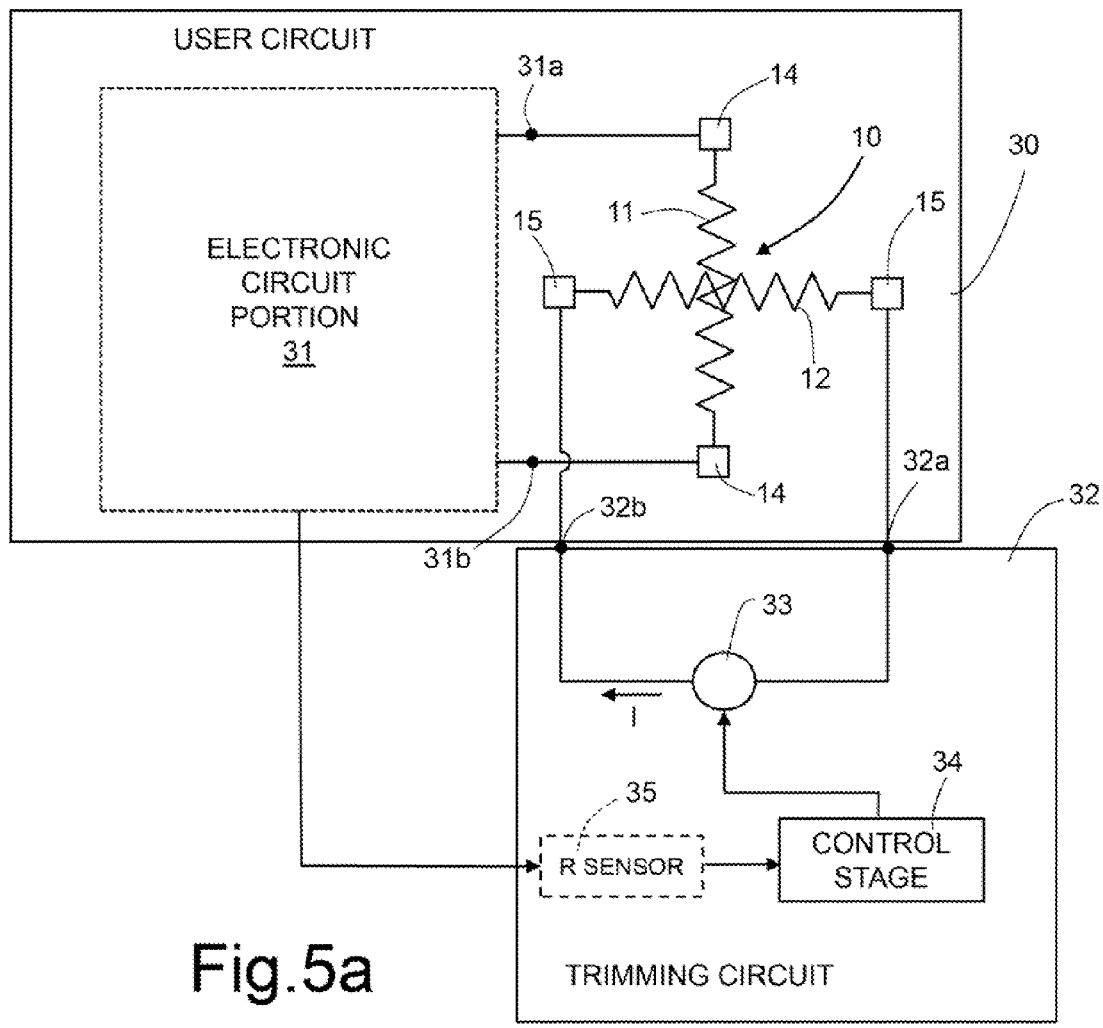
FIG. 5a is a general circuit diagram of a trimming circuit of an embodiment of the present resistor.

FIG. 5a shows a device 30 incorporating an embodiment of the present resistor 10 to be trimmed. The device 30 is a user circuit including an electronic circuit portion 31, having terminals 31a, 31b coupled to the ends of the functional resistor 11, for example, through the first metal regions 14. The electronic circuit portion 31 may be an electronic circuit of any type, which uses the resistor 10, for example, a voltage regulator or voltage reference, a precision amplifier, or simply a structure for coupling to external contact pads.

An external trimming circuit 32 has terminals 32a, 32b coupled to the ends of the trimming resistor (second portion) 12, for example, through the second metal regions 15. Trimming circuit 32 may thus be coupled to the trimming resistor 12 only during trimming for modifying the resistance of the functional resistor 11 and verifying that the correct resistance value has been attained, without interfering with the operation of the electronic circuit portion 31.

The trimming circuit 32 comprises a trimming-pulse generator, here a current source 33, coupled between the terminals 32a, 32b, and a control stage 34, which generates control signals for the current source 33, for example, a signal for turning on/off the current source 33 (or a switch coupled thereto) or a modulated signal in order to obtain controllable current, and thus trimming temperature, profiles. The trimming circuit 32 may also comprise a sensor 35, co-operating with the control stage 34. Sensor 35 measures one of the electrical parameters of the electronic circuit portion 31, whose value depends on the resistance value of the functional resistor 11, for example the offset voltage of an operational amplifier (not shown) comprised in the electronic circuit portion 31. In fact, operational amplifiers may be affected by an offset that may be adjusted, e.g., by the present resistor and whose value may be used for trimming the same resistor 10. Furthermore, the trimming circuit 32 may also comprise a resistance meter, for example, forming part of the control stage 34, for measuring the resistance of the functional resistor 11, so as to achieve a more accurate trimming and/or enable a dynamic modification of the resistance of the functional resistor 11, and thus of the adjustable resistor 10, during operation of the user device 30. Alternatively, and in a way not shown, the electrical circuit portion 31 may comprise a resistance meter, which measures the resistance of the functional resistor 11 and supplies a signal corresponding to the trimming circuit 32, for a more accurate adjustment, or may comprise a piece of equipment that measures one of the electrical parameters of the device 30, whose value depends on the resistance value of the functional resistor 11.

Figure 5B:
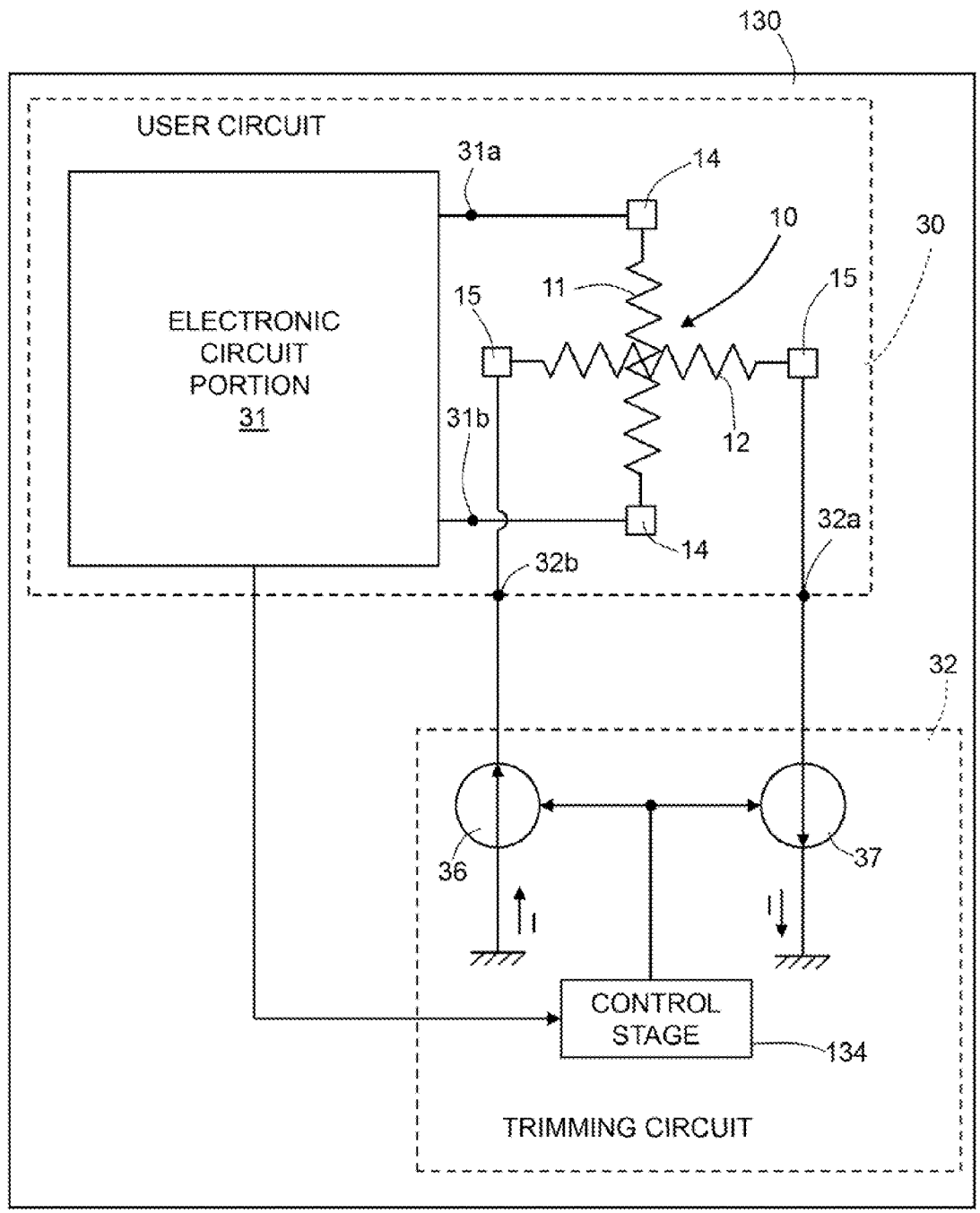
FIG. 5b is a general circuit diagram of a trimming circuit of another embodiment of the present resistor.

FIG. 5b illustrates an embodiment wherein a trimming circuit 132 is integrated in a same chip 130 as the user circuit 30, and thus as the resistor 10.

Here, the trimming circuit 132 comprises two current sources 36 and 37, each coupled to a respective terminal 32a and 32b and generating an approximately same current I respectively entering and coming from the trimming resistor 12. The amplitude of current I is controlled by a control stage 134, similar to the control stage 34 of FIG. 5a. Thereby, approximately no current fed by the trimming circuit 132 is fed to the electronic circuit portion 31.

Before trimming, the electronic circuit portion 31 is uncoupled from supply voltage Vcc and ground (not shown) so as to decouple the resistor 10 from the rest of the electronic circuit portion 31. Thus, thanks to the symmetry of the structure of the resistor 10, the current flowing in the trimming resistor 12 does not generate any potential difference between any nodes of user circuit 31 and between the two terminal 14 of the functional resistor 11.

A similar effect may be obtained if the supply voltage and ground are coupled to a power supply (not shown), provided that the latter is galvanically insulated from the trimming circuit. In this case, the resistor 10 may be trimmed also during operation of the electronic circuit portion 31; in addition, in this case, any electrical quantity of the electronic circuit portion 31 that depends on the value of the resistance of the functional resistor 11 may be used to monitor the trimming process, and obtain the desired value.

Figure 6:
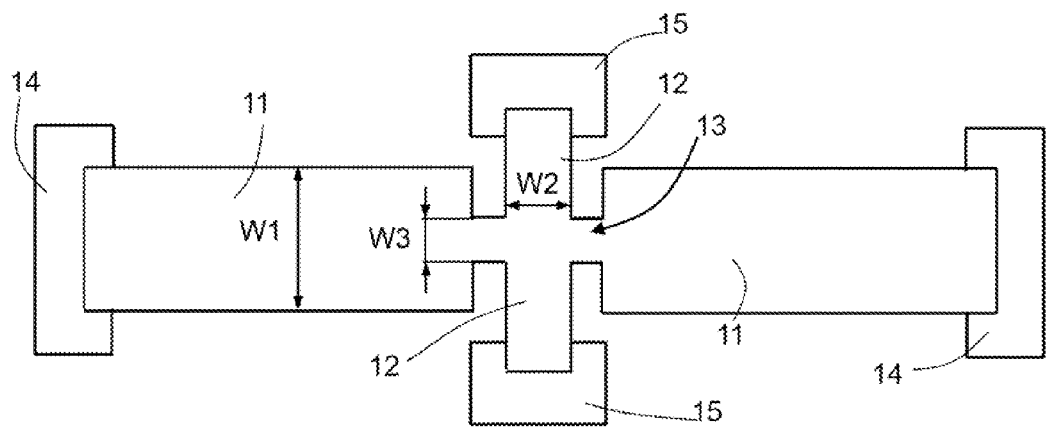
FIGS. 6 and 7 are top plan views of different embodiments of the present resistor.

FIG. 6 illustrates an embodiment in which the width W of the first portion 11 is not constant. In particular, the first portion 11 has a first width W1 for the majority of its extension, and a second width W3<W1 in the proximity of crossing with the second portion 12. The second portion 12 has a constant width W2.

This embodiment may enable the area of trimming to be confined better in the crossing area 13.

Figure 7:
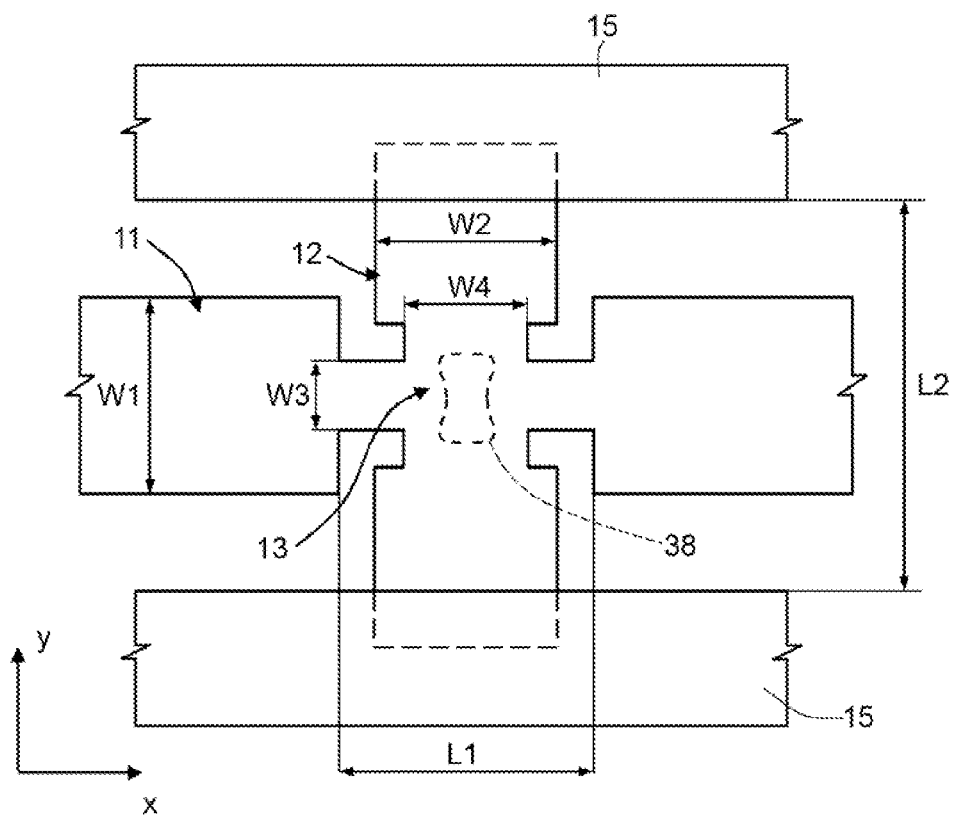

FIG. 7 illustrates an embodiment in which the width of both portions 11 and 12 is variable. In particular, the first portion 11 has a first width W1 for the majority of its extension, and a second width W3<W1 in proximity of the crossing area 13, and the second portion 12 has a first width W2 close to the second metal regions 15 and a second width W4<W3 in proximity of the crossing area 13.

Figure 8:
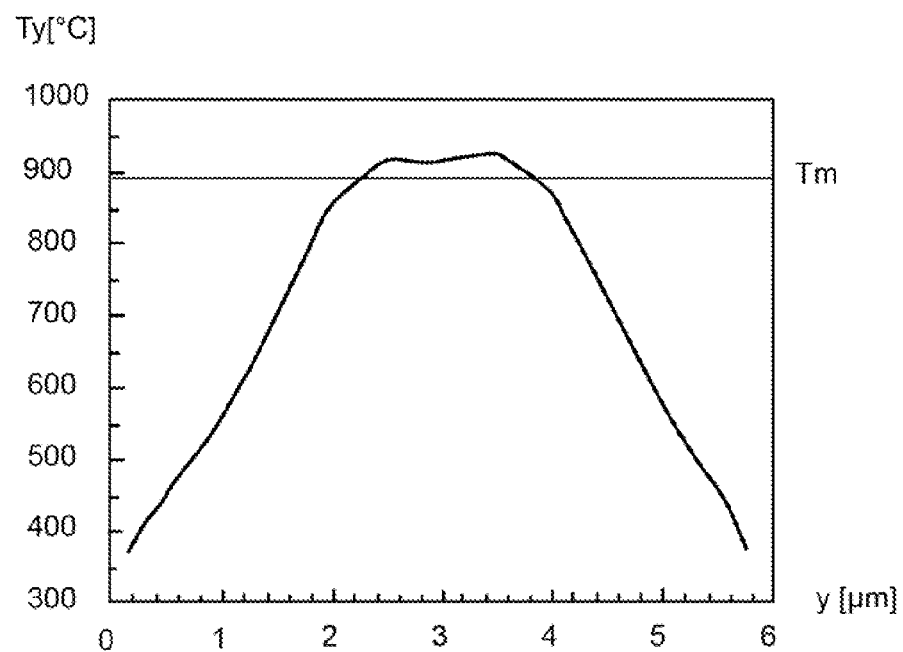
FIGS. 8 and 9 show the temperature plot in the vertical and horizontal directions of the resistor of FIG. 7.
Figure 9:
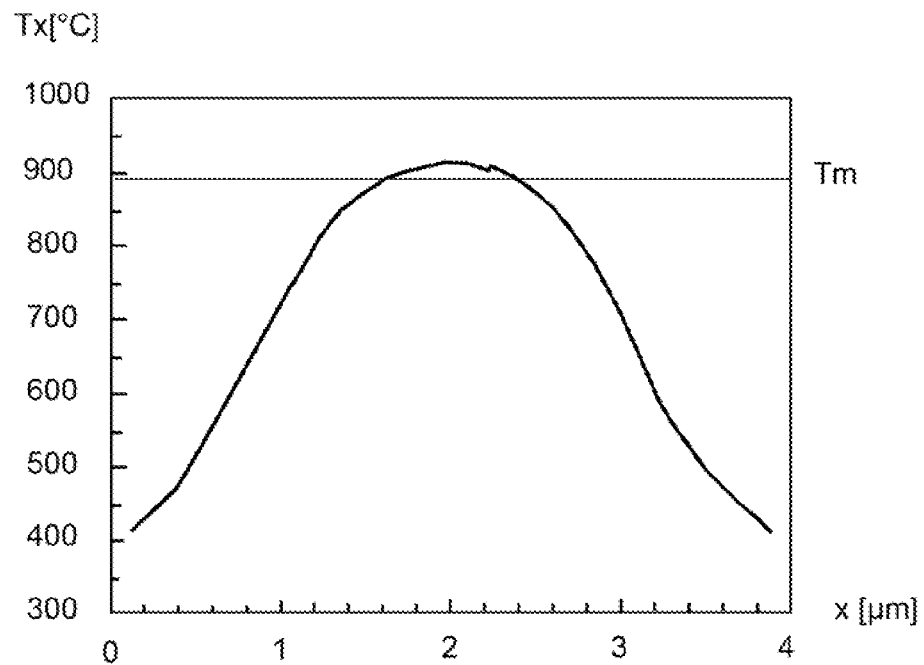

This embodiment further improves the confinement of the area subject to resistivity change at the crossing area 13, as shown also by the graphs of FIGS. 8 and 9, which represent, respectively, the temperature behavior Ty in the longitudinal direction of the second portion 12 (vertical direction Y) and the temperature behavior Tx in the longitudinal direction of the first portion 11 (horizontal direction X). In particular, the plots have been obtained for a phase-change material with stoichiometry $Ge_2Sb_2Te_5$, in the case of L1=4 µm, L2=6 µm, W1=3 µm, W2=3 µm, W3=1 µm, W4=2 µm, with a thickness of the portions 11 and 12 equal to 50 nm and applying a voltage of 5 V across the second portion 12. Here, L1 is the length of the narrow area of the first portion 11, L2 is length of the second portion 12, and W1 to W4 are the widths indicated above. Furthermore, the first portion 11 is not biased. As may be noted, both curves represent an approximately constant maximum region, at a temperature T>Tm, where Tm is the melting point (e.g. 620° C. in the case of GST), and this region is contained within the crossing area, as highlighted also in FIG. 7, where a dashed line 38 indicates the isotherm at T=Tm and thus delimits the region in which a temperature higher than the melting point is obtained, in the aforesaid conditions.

In general, simulations have shown that good efficiency values are obtained when the narrow area of the trimming resistor 12 is wider than the narrow area of the functional resistor 11, i.e., when W4>W3.

In this case, in fact, a greater effectiveness and a further reduction of the power necessary for trimming are achieved, thus further reducing the risks of damage and the power employed.

Figure 10:
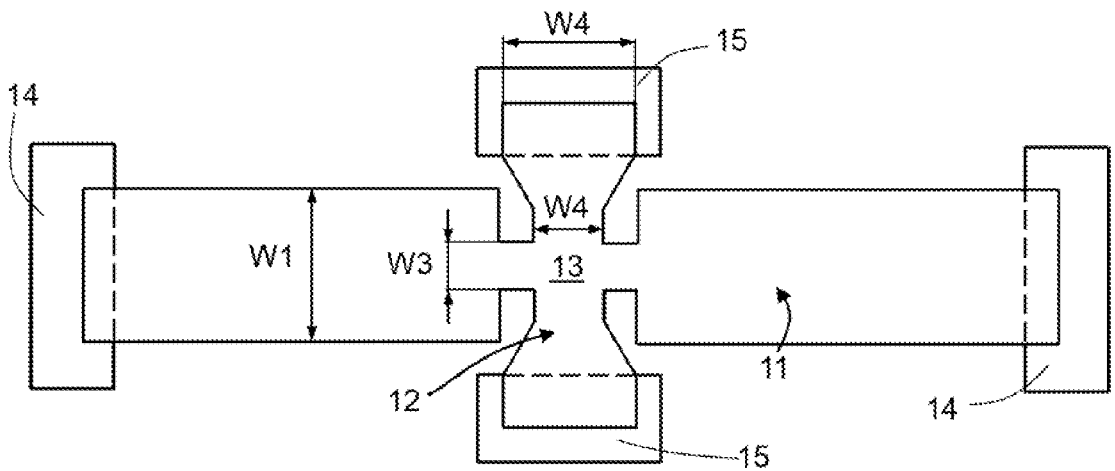
FIGS. 10-12 are top plan views of different embodiments of the present resistor.
Figure 11:
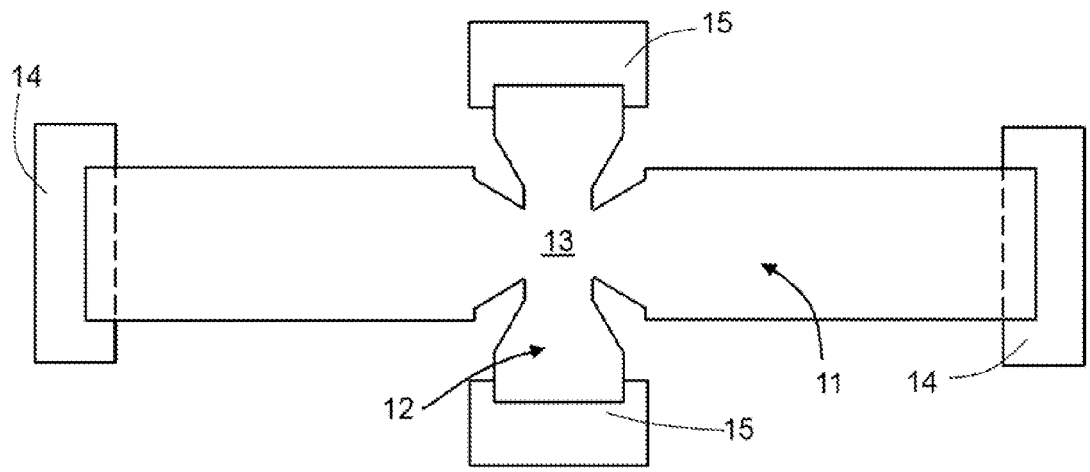

FIG. 10 illustrates an embodiment in which the second portion 12 has a first constant width in proximity of the crossing with the first portion 11, and then a width that increases as far as the second metal regions 15. Alternatively, the second portion 12 may have no constant width areas. Here, the first portion 11 has two widths W1 and W3<W1 in proximity of the crossing area 13, analogously to FIGS. 6 and 7; however, the first portion 11 may have a constant width, or else a width gradually increasing from the crossing area, passing from W3 to W1, or increasing in stepwise fashion, as shown, for example, in FIG. 11.

Figure 12:
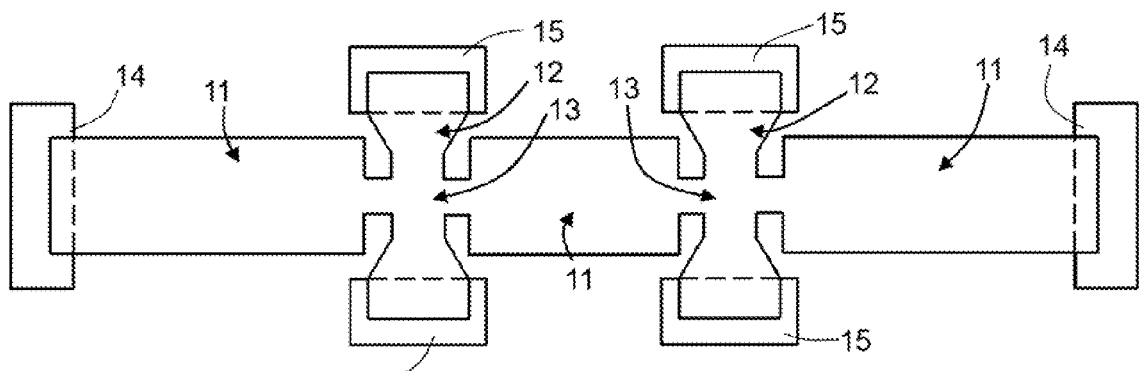

FIG. 12 shows an embodiment with more than one crossing area 13. In fact, according to the volume of resistive material that is to undergo phase change to achieve the desired resistance value, with the required accuracy, it may be possible to insert a plurality of second portions 12, each defining its own crossing area 13 with the first portion 11.

In this case, the geometry of the portions 11, 12 may be any illustrated in FIGS. 4, 6, 7, 10, 11 with a constant width or a width that varies in a stepwise fashion and/or with inclined stretches.

Figure 13:
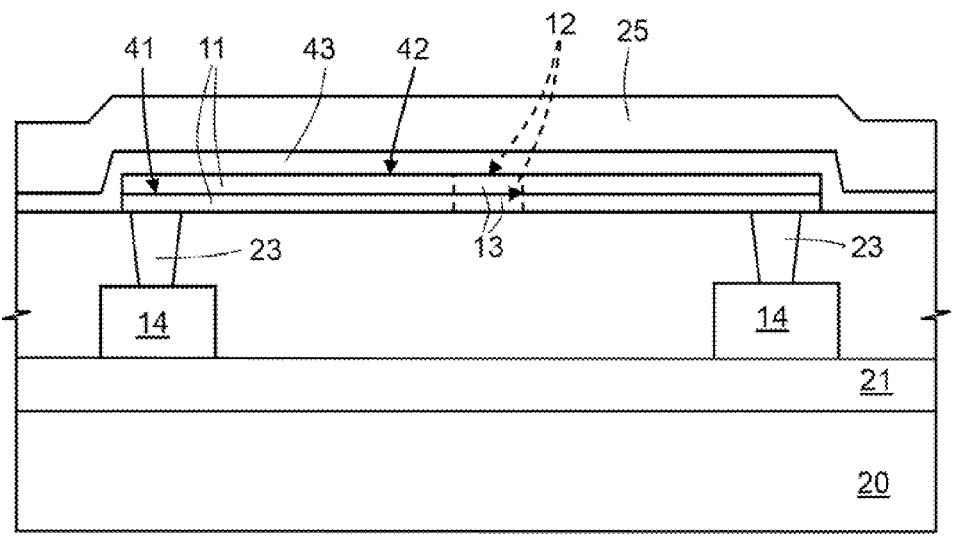
FIGS. 13 and 14 are cross-sections of other embodiments of the present resistor.

FIG. 13 shows a cross-section of the resistor 10 in an embodiment of the resistor that has an approximately zero temperature coefficient and is electrically trimmable, obtained by parallel coupling two layers in different phases. In particular, in FIG. 13, the resistor 10 (similar to the resistor illustrated in FIG. 13 of the above Italian patent application TO2008A000951, which is incorporated reference) comprises a bottom region 41 and a top region 42, with different phases, parallel-coupled directly on top of one another and covered by a top dielectric layer 43. Both regions 41, 42 are cross-shaped, with one of the conformations illustrated in FIGS. 4, 6, 7, 10, 11 and are thus formed by first portions 11 crossed by second portions 12 in crossing areas, designated once again by 13.

For example, the regions 41, 42 in the metallic and in the semiconductor phase, respectively, may be made by laying in sequence two layers that are defined using a single photomask.

In particular, the regions 41 and 42 may have the same composition, for example, $Ge_2Sb_2Te_5$, and be deposited at different temperatures, or annealed at a proper temperature in order to obtain a mixed phase with TCR~0 (e.g., absolute value <50 ppm/° K), or else may have a different composition so that one of the two will have a positive TCR and the other a negative TCR. An example of two compositions that may be used in this regard is provided by FIG. 6(*a*) of the article by Matsunaga et al., "Structural characteristics of GeTe-rich GeTe—$Sb_2Te_3$ pseudobinary metastable crystals", J. Appl. Phys. vol. 103, p. 093511 (2008), which is incorporated by reference and where two compositions (GeTe and $Ge_8Sb_2Te_{11}$) are shown, which are stable in the metallic phase (TCR>0) and semiconductor phase (TCR<0), respectively, up to melting point.

Figure 14:
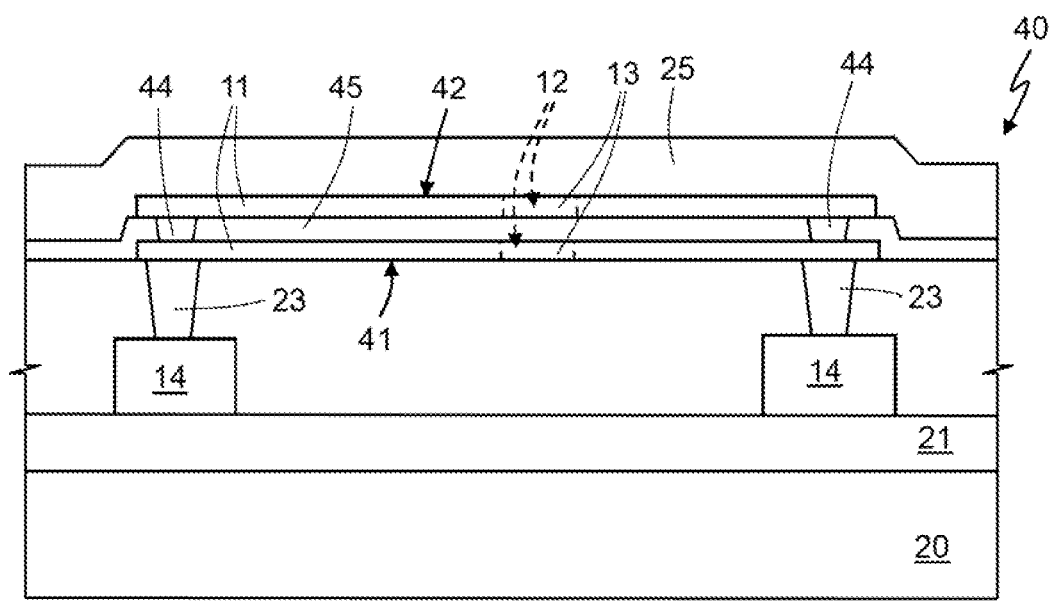

FIG. 14 shows a different embodiment with parallel coupling of two regions. In this embodiment (which is similar to the one illustrated in FIG. 14 of the above Italian patent application TO2008A000951, which is incorporated by reference), the top region 42 extends over the bottom region 41, separated therefrom by a top dielectric layer 45 and electrically coupled to the ends by top vias 44.

Also in FIG. 14, the bottom region 41 may be formed, for example, in the metallic phase, and the top region 42 may be formed in the semiconductor phase. In this case, the bottom region 41 may be simply strip-shaped, and the top region 42 may be cross-shaped. Alternatively, both regions 41, 42 and the top dielectric layer 45 may have one of the cross-like conformations illustrated in FIGS. 4, 6, 7, 10, 11, and thus have a first portion 11 crossed by a second portion 12 in the crossing area 13.

In both embodiments of FIGS. 13 and 14, by appropriately choosing the deposition parameters, in particular the deposition temperature and the thickness of the regions 41, 42, it may be possible to manufacture the resistor 10 with an approximate resistance value and with an approximately zero temperature coefficient. The exact resistance value may be trimmed in the way explained above, by heating the crossing area 13 thanks to the passage of current in the transverse portion 12. In this case, the trimming thus serves to achieve a particularly precise resistance value and/or to dynamically modify the resistance of the resistor 10 on the basis of the existing requirements.

Figure 15:
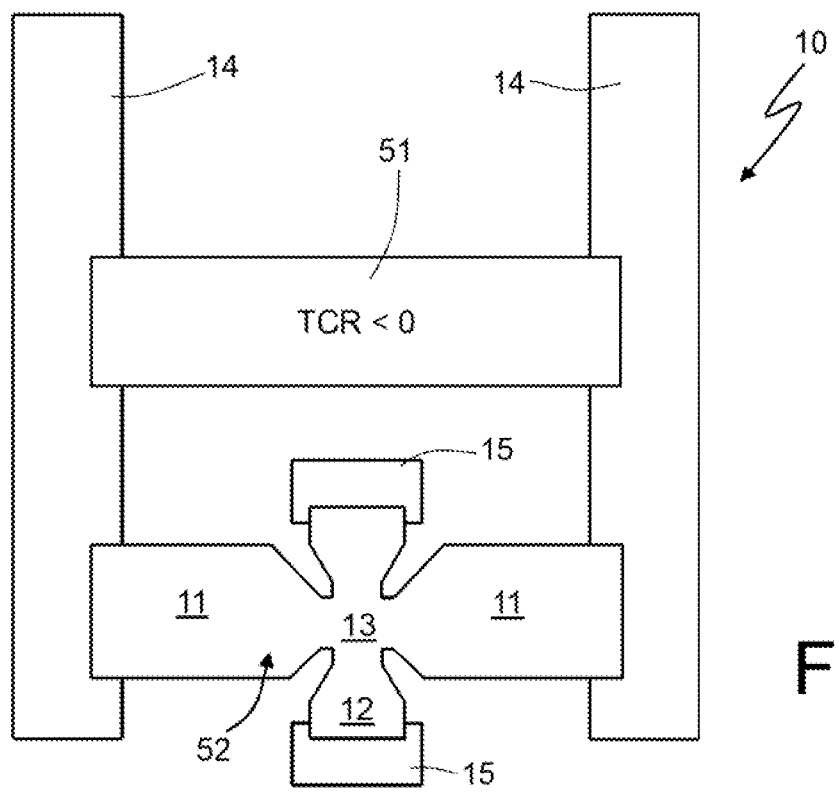
FIG. 15 is a top plan view of a further embodiment of the present resistor.

An alternative embodiment of parallel coupling is illustrated in FIG. 15, where a resistor 10 is formed by a first branch 51 and a second branch 52, made on the same plane and coupled in parallel by two metal connections, designated once again by 14. One of the two branches (in the example, the first branch 51) is in the semiconductor phase and has TCR<0, and the other branch (here the second branch 52) is in the metallic phase and has TCR>0. Alternatively, both branches 51, 52 may be in the same phase (metallic or semiconductor). The second branch 52 is similar to the resistor 10 of FIGS. 4, 6, 7, 10, and 11 and has a first portion 11 and a second portion 12 that crosses the first portion 11 in the crossing area 13. In the example shown, both the first and the second portions 11, 12 have a width that reduces linearly in proximity of the crossing area.

In this case, manufacture of the resistor 10 may comprise depositing a first phase-change material layer at a temperature and with a composition such as to obtain the metallic phase. Then, the second branch 52 is defined with the first and second portions 11, 12. Next, a second phase-change material layer is deposited at a second temperature or with a composition such as to obtain a semiconductor phase. Then, the second phase-change material layer is defined so as to form the first branch 51.

As indicated, the composition of the materials that constitute the first branch 51 and the second branch 52 may be the same (for example, $Ge_2Sb_2Te_5$) or different (for example, GeTe and $Ge_8Sb_2Te_{11}$).

The resistance of the resistor is then trimmed precisely by modifying the phase of the crossing area in the second branch 52, in the way already described above.

According to a different embodiment, both branches 51, 52 may have a cross-like conformation according to any one of FIGS. 4, 6, 7, 10 and 11.

An embodiment of the integrated resistor described herein may have numerous advantages; for example, it may be precisely trimmed both during manufacture, at a wafer level, and after packaging. Trimming of the functional resistor 11 may be performed using an external or an internal circuit, with the user circuit being decoupled from any power source or being coupled with the trimming circuit coupled to the power source via a galvanic insulation structure. Furthermore, it enables dynamic resistance modification even during operation of the device as packed and assembled in an electronic apparatus that incorporates it when the device integrates a trimming circuit, as illustrated in FIG. 5b. Trimming may be periodic or when needed, as determined by a feedback network and a control stage.

The trimming may require voltages markedly lower than in known solutions; thus also the risks of damage and the dissipation may be reduced.

The trimming current and trimming voltage do not depend upon the geometry of the functional resistor but only upon that of the trimming resistor, thus facilitating determination of the electrical parameters to be used for obtaining accurate values of resistance, even in the absence of a real-time feedback.

No specific process steps are required for production of an embodiment of the present resistor in so far as it may be made simply by modifying the mask for defining the resistor so as to form the second portion (or trimming resistor) 12, and the mask or the masks for production of the electrical-connection regions 14, 15.

The sizing of the resistor 10 does not pose additional requirements; in particular, sizing of the trimming resistor 12 does not entail limitations as regards sizing of the functional resistor 11.

Finally, it is clear that modifications and variations may be made to embodiments of the high-precision resistor, to the trimming method, and to the manufacturing method described and illustrated herein, without thereby departing from the scope of the present disclosure.

In particular, even though an embodiment has been described with reference to phase-change materials, it is applicable also to other materials, such as polysilicon or other metal alloys commonly used for the production of thin-film resistors, such as SiCr, NiCr, TaN, SiTa.

For a resistor of a phase-change material, this may have a single composition and/or a crystalline structure or may be made up of different layers with the same composition and/or crystalline structure, or with different compositions and/or crystalline structures. The temperature coefficient of resistance (TCR) may be zero, as taught in the above Italian patent application, or different from zero when the application does not require a stability of the resistance value as the temperature varies or envisages a different dependence upon temperature (positive or negative); the functional resistor 11 may be made up of regions with different composition or structure, coupled in series, in parallel, or in a series/parallel combination. The width of the functional resistor 11 may be the same as or greater than that of the trimming resistor 12.

When the functional resistor 11 and/or the trimming resistor 12 have a smaller width in proximity of the crossing area, the width reduction may be obtained stepwise and/or gradually, with lines having any shape (with rectilinear or curved stretches).

As already mentioned, it may be possible to provide more trimming points, with modular structures, so that once the geometry of the crossing point (trimming module) is fixed, it may be possible to determine the trimming current/voltage irrespective of the resistance $R_1$ of the functional resistor 11. The number of modules may also depend upon the volume that it is intended to trim and/or upon the desired precision.

The electrical-connection regions 14, 15 may be provided either on or underneath an embodiment of the resistor, and in general the layers on which the present resistor is formed may vary with respect to what has been shown, according to the technology used and the integrated device that houses an embodiment of the resistor presented herein.

Finally, the current source 33 may be replaced by a voltage generator.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An article, comprising:
   a first region having ends and a first inner portion disposed between the ends and formed from a first material having an electrically modifiable resistivity;
   a second region having ends and intersecting the first region at the inner portion; and
   a third region disposed in electrical parallel with the first region.

2. The article of claim 1 wherein the first material comprises a phase-change material.

3. The article of claim 1 wherein the first and second regions are formed from the first material.

4. The article of claim 1 wherein one of the first and second regions is longer than the other of the first and second regions.

5. The article of claim 1 wherein one of the first and second regions is wider than the other of the first and second regions.

6. The article of claim 1 wherein both the first and second regions include the inner portion.

7. The article of claim 1 wherein at least one of the first and second regions has a first width adjacent to the inner portion and a second width adjacent to at least one of the respective end portions.

8. The article of claim 1 wherein at least one of the first and second regions has a first width adjacent to the inner portion, a second width adjacent to at least one of the respective end portions, and a transition portion disposed between the inner portion and the at least one end portion and having a width that transitions from the first width to the second width.

9. The article of claim 1, further comprising the third region having ends and disposed over the first region.

10. The article of claim 1, further comprising the third region having ends and disposed adjacent to the first region.

11. The article of claim 1, further comprising:
    first and second electrical contacts coupled to the respective ends of the first region; and
    third and fourth electrical contacts coupled to the respective ends of the second region.

12. The article of claim 1 wherein:
    the inner portion has a resistivity with a temperature coefficient of a first polarity; and
    another portion of the first region has a resistivity with a temperature coefficient of a second polarity.

13. The article of claim 1 wherein a portion of at least one of the first and second regions other than the inner portion is formed from the first material.

14. The article of claim 1 wherein second region is operable to conduct a current from one end to the other end, the current sufficient to cause a resistivity of the first material to change.

15. The article of claim 1 wherein second region is operable to conduct a current from one end to the other end, the current sufficient to cause a phase of the first material to change.

16. An article, comprising:
    a first region having ends and a first inner portion disposed between the ends and formed from a first material having an electrically modifiable resistivity;
    a second region having ends and intersecting the first region at the inner portion;
    wherein the first region has a second inner portion disposed between the ends and formed from a second material having an electrically modifiable resistivity; and
    a third region having ends and intersecting the first region at the second inner portion.

17. The article of claim 16 wherein the second material is approximately the same as the first material.

18. An integrated circuit, comprising:
    a circuit element, including
        a first region having ends and a first inner portion disposed between the ends and formed from a first material having an electrically modifiable resistivity;
        a second region having ends and intersecting the first region at the inner portion; and
        a third region disposed in electrical parallel with the first region.

19. The integrated circuit of claim 18 wherein the circuit element comprises a resistor.

20. The integrated circuit of claim 18 wherein:
    the first region is operable to conduct a current from one end to the other end during an operating mode; and
    the second region is operable to conduct a current from one end to the other end during a resistivity-setting mode.

21. The integrated circuit of claim 18, further comprising a circuit that is coupled to the ends of the first region.

22. The integrated circuit of claim 18, further comprising a resistance trimming circuit that is coupled to the end of the second region.

23. A system, comprising:
    a first integrated circuit, including
        a circuit element, including
            a first region having ends and a first inner portion having a first resistivity with a temperature coefficient of a first polarity; the inner portion disposed between the ends and formed from a first material having an electrically modifiable resistivity, the first region having a second portion with a resistivity having a temperature coefficient of a second polarity; and
            a second region having ends and intersecting the first region at the inner portion; and
    a second integrated circuit coupled to the first integrated circuit.

24. The system of claim 23 wherein the first and second integrated circuits are disposed on respective dies.

25. The system of claim 23 wherein the first and second integrated circuits are disposed on a same die.

26. The system of claim 23 wherein at least one of the first and second integrated circuits comprises a computing circuit.

* * * * *